United States Patent [19]

Blanchard et al.

[11] Patent Number: 4,724,218

[45] Date of Patent: Feb. 9, 1988

[54] METHOD OF FORMING A SEMICONDUCTOR DEVICE HAVING SEVERAL GATE LEVELS

[75] Inventors: Pierre Blanchard, Verrieres Le Buisson; Jean P. Cortot, Grenoble, both of France

[73] Assignee: Thomas-CSF, Paris, France

[21] Appl. No.: 873,679

[22] Filed: Jun. 12, 1986

[30] Foreign Application Priority Data

Jun. 18, 1985 [FR] France ............................... 85 09242

[51] Int. Cl.⁴ .......................................... H01L 31/18
[52] U.S. Cl. ...................................... 437/4; 437/53; 437/191; 437/195; 437/233
[58] Field of Search ............... 29/571, 591, 580, 578; 357/59 G, 24 LR, 71, 59 J; 156/653, 657; 437/4, 53, 233, 191

[56] References Cited

U.S. PATENT DOCUMENTS

| | | | |
|---|---|---|---|
| 3,943,543 | 3/1976 | Caywood | 357/24 |
| 4,035,829 | 7/1977 | Iprietal | 357/59 G |
| 4,055,885 | 11/1977 | Takemoto | 29/578 |
| 4,141,024 | 2/1979 | Kano et al. | 357/30 D |
| 4,577,392 | 3/1986 | Peterson | 156/647 |

FOREIGN PATENT DOCUMENTS 0026376 9/1980 European Pat. Off.
0099603 6/1983 European Pat. Off.

OTHER PUBLICATIONS

R. Gdula et al., *CCD with Two Levels of Polysilicon*, IBM Tech. Disc., vol. 21, No. 5, Oct. 1978.

*Primary Examiner*—Brian E. Hearn
*Assistant Examiner*—Kevin McAndrews
*Attorney, Agent, or Firm*—Roland Plottel

[57] ABSTRACT

The invention provides a method for forming a semiconductor device having several gate levels, which, in the case of forming a device with two gate levels, comprises the following steps:

1. on a semiconductor substrate are deposited a dielectric layer, then a layer of material in which the gates of the first level are to be formed and a dielectric layer;
2. the gates of the first level are formed by etching the two upper layers;
3. the sides of the gates of the first level are isolated;
4. a second layer is deposited of material in which the gates of the second level are to be formed;
5. in this second layer an opening is formed giving access to the dielectric layer covering the top of the gates of the first level;
6. by plasma etching or by chemical etching the zones of said second layer which overhang the gates of the first layer are removed by etching them simultaneously on their internal and external faces.

5 Claims, 10 Drawing Figures

METHOD OF FORMING A SEMICONDUCTOR DEVICE HAVING SEVERAL GATE LEVELS

BACKGROUND OF THE INVENTION

1. Field of the Invention

The present invention relates to a method of forming a semiconductor device with several gate levels.

The invention may be used in particular for forming charge transfer devices and in the following description this field will be preferably discussed. The invention may however be used for forming any semiconductor device comprising several gate levels, such for example as a photosensitive zone formed of MOS transistors.

It will be recalled that it is the general custom in this field to designate by the expression "several gate levels", gates which are coplanar but which have not been formed simultaneously. Thus, it is possible to treat differently the semiconductor substrate situated under these different gates. For example, in the case of charge transfer devices, for forming a device with two gate levels, in which the disymmetry in the channel potentials required for making the transfer unilateral is provided by ionic implantation, the substrate situated under the gates of the first level must be doped, then the gates of the first level must be formed, then the substrate situated under the gates of the second level must be doped and the gates of the second level must be formed.

2. Description of the Prior Art

In the prior art charge transfer devices are known having several gate levels with disymmetry by ionic implantation.

The disadvantage of current technologies is that they lead to devices in which there is relatively considerable overlapping of the gates of the upper technological level on those of the underlying level. Such overlapping introduces not inconsiderable capacitive coupling between gates, which disturbs the operation of the device.

In addition, this coupling may be different from one device to another which is troublesome in particular in devices with two phase structure in which two electrodes of two different levels are connected together. Since the parasite capacities are not identical, the different electrode pairs present different access times and may require clock signals adapted depending on the devices.

In addition such overlapping introduces a relief which is troublesome when maximum integration is sought.

SUMMARY OF THE INVENTION

The present invention provides a method of forming a semiconductor device with n gate levels, comprising the following steps:

(1) on a semiconductor substrate are deposited a dielectric layer then a layer of material in which are to be formed the gates of the first level and a dielectric layer;

(2) the gates of the first level are formed by etching the two upper layers;

(3) the sides of the gates of the first level are isolated;

(4) a second layer of material is deposited in which the gates of the second layer are to be formed;

(5) in this second layer an opening is formed giving access to the layer of dielectric covering the top of the gates of the first level;

(6) a thin dielectric layer is deposited on the gates of the second level;

(7) a third layer of material is deposited in which the gates of the third level are to be formed;

(8) the gates of the third level are etched;

(9) and so on, a thin dielectric layer is deposited on the gates of the last level deposited, then a new layer of material is deposited in which are to be formed the gates of the upper level and these gates are etched;

(10) once all the gates have been etched the accessible zones of the thin dielectric layers (8) covering the grids are suppressed from the gates of the second level ($G_2$);

(11) then, by usning one of the following technques: plasa etching, chemical etching, the zones of the second gates which overhang a gate of the first level are suppressed by etching them simultaneously on their internal and external faces.

The present invention also relates to a method of forming a semiconductor device with n gate levels, comprising the following steps:

(1) on a semiconductor substrate are deposited a dielectric layer, then a layer of material in which are to be formed the gates of the first level and a dielectric layer;

(2) the gates of the first level are formed by etching the two upper layers;

(3) the sides of the gates of the first level are isolated;

(4) a second layer of material is deposited in which are to be formed the gates of the second level;

(5) a thick oxide layer is deposited on the gates of the second level;

(6) the gates of the second level are etched while forming in these gates an opening giving access to the dielectric layer covering the top of the gates of the first level;

(7) a thin oxide layer is grown on the walls of the gates of the second level which were uncovered during etching of these gates;

(8) a third layer of material is deposited in which the gates of the third level are to be formed;

(9) a thick oxide layer is deposited on the gates of the third level;

(10) the gates of the third level are etched;

(11) a thin oxide layer is grown on the walls of the gates of the third level which were uncovered during etching of these gates;

(12) and so on, a thick oxide layer is deposited on the gates of the last level deposited, then these gates are etched, a thin oxide layer is caused to grow on the walls of the gates of the last level which were uncovered during etching of these gates, and a new layer of material is deposited in which are to be formed the gates of the upper level;

(13) once all the gates have been etched, the thick oxide layers which cover these gates are suppressed;

(14) by using one ofthe following techniques: plama etching, chemical etching, the zones of the gates which overhang the gates of another level are suppressed by etching them simultaneously on their internal and external faces.

The process of the invention has the advantage of only using standard technologies. In addition, it may be applied whatever the relief of the substrate used, and in particular whether it is planarized or not.

The method of the invention allows a semiconductor device with several gate levels to be formed, such for example as the one shown in FIG. 8, which has the following advantages:

overlapping between the gates of the different levels is constant and limited to the slope of the sides of the gates of the lower level. This overlapping is therefore solely lateral and introduces parasite capacities of much smaller values than those existing in the prior art devices. Thus, for example, lateral overlapping of 0.35 $\mu$m is obtained whereas in the prior art the overlapping is generally 1.5 $\mu$m;

the transfer efficiency is maximum;

finally, the device is planarized as can be seen in FIG. 8.

A recent technology is known which allows a structure closely related to the one shown in FIG. 8 to be obtained. This technology generally called "RIE, reactive ion etching" is based on an etching technique. Its use is delicate and it gives results which are not always satisfactory. In addition, the substrate on which the gates are formed must be planarized.

The method of the invention, with respect to the "RIE" technology, has the advantages of simplicity, efficiency and also the advantage of being able to be used on a substrate whether planarized or not.

BRIEF DESCRIPTION OF THE DRAWINGS

Other objects, characteristics and results of the invention will be clear from the following description, given by way of non limitative example and illustrated by the accompanying Figures which show.

In the different Figures the same references designate the same references but, for the sake of clarity, the sizes and proportions of the different elements have not been respected.

DESCRIPTION OF THE PREFERRED EMBODIMENTS

FIGS. 1 to 8 show different steps of the method of the invention, in the case of forming a semiconductor device having two gate levels, where the first level is formed on a dielectric layer.

Figure 1:
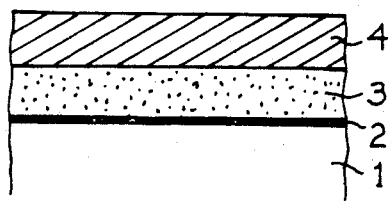
FIGS. 1 to 8, different steps in the method of the invention in the case of forming a semiconductor device with two gate levels.

In FIG. 1 has been shown the semiconductor substrate 1 covered with a dielectric layer 2 then a layer 3 of material in which are to be formed the gates of the first level and another dielectric layer 4.

The semiconductor substrate 1 may be made from monocrystalline silicon. It may also be the silicon layer of an SOS structure or of any other semiconductor.

The dielectric layer 2 may be formed from one or more dielectric layers. For example, this layer may be formed from silica or nitride or silica covered with nitride.

The layer 3 of material in which the gates of the first level are to be formed may be made from polycrystalline silicon or polycrystalline silicon covered with silicide for example. If the device to be formed is not a charge transfer device, this layer 3 may be made from metal, from aluminium for example.

The dielectric layer 4 is for example an oxide layer, of silica for example. This oxide layer may be obtained by oxide growth or by deposition, pyrolitic for example.

When layer 3 is made from metal, a low temperature oxide deposit 4 is formed, for example a pyrolytic deposit or a plasma deposit.

Figure 2:
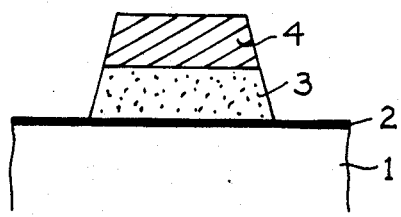

In FIG. 2, it has been shown that layers 3 and 4 are etched by photolithographic etching.

The slope of the sides of the gates of the first level thus obtained will determine the final overlapping between gates of the first and second levels.

Figure 3:
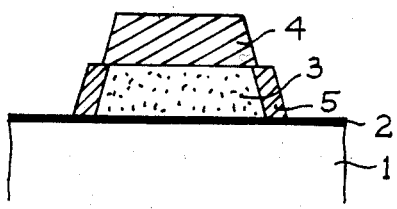

The step illustrated in FIG. 3 consists in isolating the sides of the gates of the first level formed.

That may be effected for example by oxide growth 5 as shown in FIG. 3.

It may also be effected for example by depositing an oxide layer, pyrolitically for example.

Figure 4:
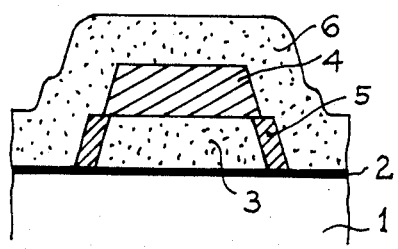

In FIG. 4, another layer 6 is deposited of a material in which the gates of the second level are to be formed.

This layer may be different from the one used for forming the gates of the first level.

Figure 5:
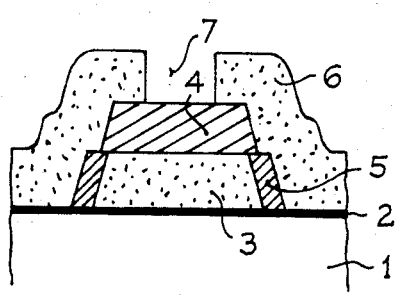

In FIG. 5 an opening 7 has been formed in this layer 6 for accessing the oxide layer 4 covering the top of the gates of the first level.

This opening may for example be formed by photo-etching or by chemical etching depending on the nature of layer 6. It is not necessary for opening 7 to be very well centered with respect to the gates of the first level, for the positioning of this opening does not condition the uniformity of overlapping between gates of the different levels. As can be seen in the description of the following Figures, the purpose of this opening is to give access to layer 4 for suppressing it and for etching layer 6 on both its faces. The positioning of opening 7 is therefore not critical.

Figure 6:
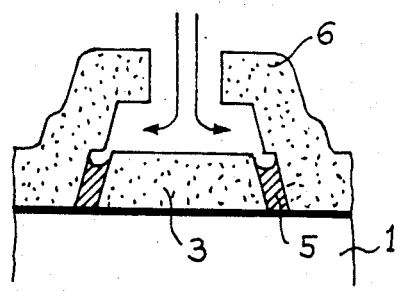

In FIG. 6 layer 4 is removed so as to lay bare the top of gate 3.

When layer 4 is formed of an oxide, it may be removed by chemical etching with hydrofluoric acid for example.

The speed of such etching may be very well controlled, which allows the oxide layers 5 to be kept which will ensure the isolation between gates of the different levels.

The next step in the method consists in removing the parts of layer 6 which overhang the gates 3 of the first level.

This step may be effected:
either by plasma etching;
or by chemical etching.

If it is desired to proceed by plasma etching, a gas is used which etches the layer 6, for example made of polycrystalline silicon.

Figure 7:
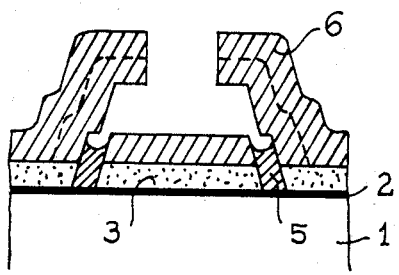

The reaction time of the gas is determined so that it acts substantially over half the thickness of layer 6. Since layer 6 is subjected by both its faces to the action of this gas in its parts overhanging layer 3, it can thus be totally eliminated in these parts and about half of it may be removed in its horizontal parts. In FIG. 7, the parts of layer 6 which will be deleted have been hatched.

Figure 8:
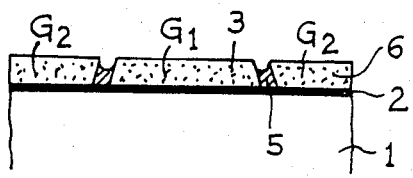

The result of the plasma etching is shown in FIG. 8. The parts of the gates of the second level 6 which overhang the gates of the first level are removed. The gates of the first and of the second levels 3 and 6, have their thickness reduced substantially by half with respect to the steps shown in FIG. 6. The overlapping between the gates of the first and the second levels, which will also be called $G_1$ and $G_2$, is therefore limited to the slope of the periphery of the gates $G_1$ which depends on the etching illustrated in FIG. 2.

The two gate levels are isolated by layer 5 whose thickness depends on the step illustrated in FIG. 3.

It can be seen that the device obtained in FIG. 8 is perfectly planarized.

The ionic implantation operations necessary for forming a charge transfer device and which are independent of the method for forming several gate levels have not been shown in FIGS. 1 to 8.

In FIG. 7, it has been illustrated how the zones of layer 6 may be removed which overhang the gates of the first level by chemical etching.

When gate 6 is made from polycrystalline silicon, such chemical etching is effected after oxidization of the gate.

The duration of oxidation is adjusted so that half the thickness of gate 6 is oxidized.

In FIG. 7, hatching symbolizes the oxidation of about half the thickness of gates 3, the flat parts of gates 6 and the whole of the overhanging parts of gate 6, since these perts are oxidized simultaneously on their internal and external faces.

With deoxidization the hatched zones are removed and the structure shown in FIG. 8 is obtained.

When gates 6 are made from metal, chemical etching is used which does not necessarily imply a previous oxidization step.

It is possible to protect the gates $G_1$ of the first level during the steps shown in FIGS. 6 to 8 by interposing a protective layer against plasma etching or chemical etching between each gate $G_1$ and layer 4. A layer of silicon nitride $Si_3N_4$ may for example be used.

Figure 9:
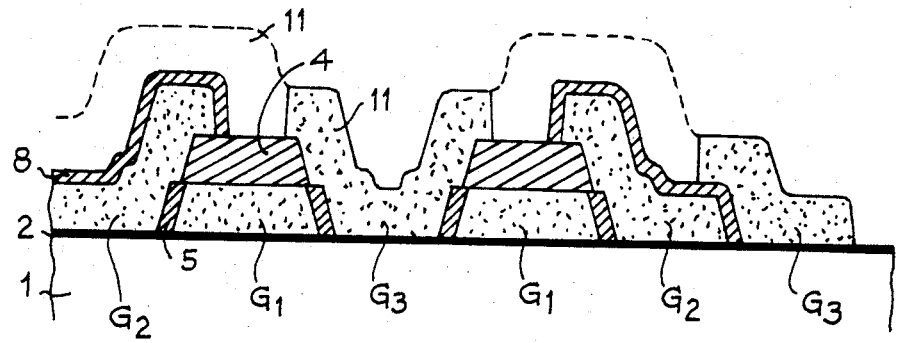
FIGS. 9 and 10, complementary steps in the case of a forming a semiconductor device with three gate levels.
Figure 10:
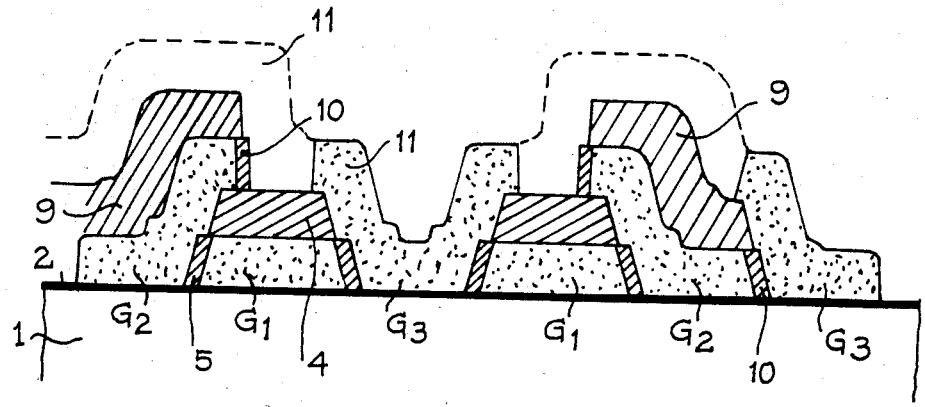

FIGS. 9 and 10 illustrate the steps which must be added in the case of forming a semiconductor device with three gate levels. FIGS. 9 and 10 illustrate two variants of the method of the invention in the case of three gate levels. It is by way of example, as in the case of FIGS. 1 to 8, a device in which the disymmetry in the channel potentials is provided by ionic implantation. The ionic implantation operations have not been shown.

The process such as it has been described above must first of all be repeated.

Then, a dielectric layer is deposited on the gates $G_2$ of the second layer so as to protect them against the etching of the gates of the third level.

In FIG. 9, a thin dielectric layer 8 is deposited on gates $G_2$ after these gates have been etched.

Layer 8 covers then the whole of the walls of these gates. This thin layer 8 may for example be a nitride or oxide layer;

In FIG. 10, a dielectric layer 9 is deposited on gates $G_2$ before these gates are etched and is etched at the same time as them.

It is a thick oxide layer whose thickness is of the same order of size as that of layer 4. This thick oxide may be obtained by plasma deposition, by a pyrolitic process or by oxide growth.

For protecting the walls of gates $G_2$ which were uncovered during etching thereof, a thin oxide layer 10 is caused to grow on these substantially vertical walls.

Then, in the embodiment shown in FIGS. 9 and 10, a third layer 11 is deposited of a material in which the gates $G_3$ of the third level are to be formed.

This layer 11 is etched. In FIGS. 9 and 10 the zones of layer 11 which were removed during this etching have been shown with broken lines.

When the etching is finished, the dielectric layer 8 or 9, in FIGS. 9 and 10, which protects the gates $G_2$ is removed;

In the embodiment shown in FIG. 9, the thin dielectric layer 8 which covers gates $G_2$ is removed everywhere except in the zones where gates $G_2$ and $G_3$ are superimposed and where this layer is indispensable for isolating the gates $G_2$ and $G_3$.

In the case of FIG. 9, the overlapping between gates $G_3$ and $G_2$ cannot be minimized.

Thus, on the right hand part of FIG. 9, it is not possible to minimize the overlapping between gates $G_2$ and $G_3$ for the gap between these gates where the thin dielectric layer 8 is situated is very small, of the order of 1000 to 2000 Å, and does not allow gates $G_3$ to be etched on their inner face.

On the other hand, in the variant shown in FIG. 10, the thick oxide layers 4 and 9 may be removed at the same time without impairing the thin oxide layers 5 and 10.

It is therefore possible to eliminate the gate sections $G_3$ overhanging the gates $G_2$ as was explained in the description of FIGS. 1 to 5.

With the variant of FIG. 10, the overlapping between the gates of the three levels $G_1, G_2$ and $G_3$ may then be minimized.

The method of the invention in the two embodiments described with reference to FIGS. 9 and 10 may be used for forming a semiconductor device with n gate levels.

In the case of the embodiment shown in FIG. 9, in order to obtain n gate levels, after the steps illustrated in FIGS. 1 to 5, the following steps are carried out:

a thin dielectric layer 8 is deposited on the gates of the second level $G_2$;

a third layer 11 is deposited of a material in which the gates of the third level $G_3$ are to be formed;

the gates of the third level are etched;

and so on, a thin dielectric layer is deposited on the gates of the last level deposited, then a new layer of material is deposited in which the gates of the upper level are to be formed and these gates are etched;

once all the gates have been etched, the accessible zones of the thin dielectric layers 8 covering the gates are eliminated from the gates of the second level $G_2$;

then, by plasma etching or by chemical etching the zones of the two gates 6, $G_2$ which overhang the gates 3 of the first level are eliminated by etching them simultaneously on their internal and external faces.

In the case of the embodiment shown in FIG. 10, in order to obtain n gate levels, after the steps illustrated in FIGS. 1 to 4, the following steps are carried out;

a thick oxide layer 9 is deposited on the gates of the second level $G_2$;

the gates of the second level $G_2$ are etched while forming in these gates an opening 7 giving access to the dielectric layer 4 covering the top of the gates 3 of the first level;

a thin oxide layer is caused to grow on the walls of the gates of the second level $G_2$ which were uncovered during etching of these gates;

a third layer 11 is deposited of material in which the gates of the third level $G_3$ are to be formed;

a thick oxide layer is deposited on the gates of the third level $G_3$;

the gates of the third level are etched;

a thin oxide layer is caused to grow on the walls of the gates of the third level which were uncovered during etching of these gates;

and so on, a thick oxide layer is deposited on the gates of the last level deposited, then these gates are etched, a thin oxide layer is caused to grow on the walls of the gates of the last level which were uncovered during etching of these gates, and a new layer is deposited of material in which the gates of the upper level are to be formed;

once all the gates are etched, the thick oxide layers 4, 9 which cover these gates are removed;

by plasma etching or chemical etching the zones of the gates which overhang the gates of another level are removed by etching them simultaneously on their internal and external faces.

All that has been discussed in so far as the formation of a device having two gate levels is concerned, on the nature of the materials, the different techniques used, etc. . . . also applies to the formation of a device having n gate levels.

Thus, for example the layers of material in which the gates are to be formed from the second level are made from polycrystalline silicon and the last step is chemical etching effected after oxidization.

Similarly, a protective layer against etching may be deposited between the gates of the different levels and the dielectric layer which covers these gates.

What is claimed is:

1. A method for forming a semiconductor device with at least two gate levels, comprising the following steps:
    a. on a seimiconductor substrate is depositied a dielectric layer, then a laeyr of material in which the gates of the first level are formed, and a dielectric layer;
    b. etching the two upper layers to pattern the gates of the first level;
    c. forming an insulating layer on the sides of the gates of the first level;
    d. depositing a second layer of material in which the gates of the second layer are to be formed;
    e. locally opening the second layer so as to expose a central portion of the dielectric layer covering a gate of the first level while leaving portions of the second layer above the sides of said gate of the first level;
    f. removing, through the opening in the second layer, the dielectric layer covering the gate of the first level, so as to expose the internal portion of the second layer overhanging the sides of the gate;
    g. etching, from inside the opening in the second layer and from outside said opening, portions of the second layer overhanging the sides of the gate of the first level.

2. A method according to claim 1, wherein, between step (d) and step (e) a thick oxide layer is deposited on the gates of the second layer.

3. The method as claimed in one of the claims 1 and 2 for forming a semiconductor device with two gate levels wherein, during the last step, the etching of the layer of material in which the gates of the second level are to be formed is adjusted so that substantially half of the thickness of this layer is removed.

4. A method according to claim 2, wherein between step (e) and step (f), and in order to form further gate levels, the following additional steps are performed:
    (i) a thin insulating layer is formed where the second layer of gates has been exposed during step (e);
    (ii) depositing a third layer of material in which the gates of a third level are to be formed;
    (iii) etching the third layer to pattern the gates of the third layer;

and wherein step (f) includes removing portions of the thick oxide layer deposited between steps (d) and (e), and wherein step (g) includes etching portions of the third layer overhanging the sides of gates of the first or second level.

5. A method according to claim 1, wherein during step (g) etching is adjusted in duration so that substantially half of the thickness of the second layer is removed from outside the opening in the second layer and half from inside the opening.

* * * * *